(12) United States Patent
Kawase et al.

(10) Patent No.: US 6,866,714 B2
(45) Date of Patent: Mar. 15, 2005

(54) LARGE SIZE SEMICONDUCTOR CRYSTAL WITH LOW DISLOCATION DENSITY

(75) Inventors: Tomohiro Kawase, Itami (JP); Katsushi Hashio, Itami (JP); Shin-ichi Sawada, Itami (JP); Masami Tatsumi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 79 days.

(21) Appl. No.: 10/430,027

(22) Filed: May 5, 2003

(65) Prior Publication Data

US 2003/0200913 A1 Oct. 30, 2003

Related U.S. Application Data

(60) Division of application No. 09/779,097, filed on Feb. 7, 2001, now Pat. No. 6,572,700, which is a continuation-in-part of application No. 09/217,349, filed on Dec. 21, 1998, now Pat. No. 6,254,677.

(30) Foreign Application Priority Data

Dec. 26, 1997 (JP) .............................................. 9-360090
Mar. 23, 1998 (JP) ............................................ 10-72969
Dec. 11, 1998 (JP) ........................................... 10-352557

(51) Int. Cl.$^7$ ......................... C30B 29/42; C30B 35/00
(52) U.S. Cl. ....................... 117/206; 117/224; 117/900
(58) Field of Search ........................... 117/81–83, 206, 117/224, 900, 953–956

(56) References Cited

U.S. PATENT DOCUMENTS

| | | |
|---|---|---|
| 3,615,878 A | 10/1971 | Chang |
| 4,404,172 A | 9/1983 | Gault |

(List continued on next page.)

FOREIGN PATENT DOCUMENTS

| | | |
|---|---|---|
| DE | 2142388 | 6/1972 |
| EP | 0290322 | 11/1968 |
| EP | 0559921 | 9/1993 |
| FR | 2535312 | 5/1964 |
| GB | 2205087 | 11/1988 |
| GB | 2130192 | 5/1994 |
| JP | 55140792 | 4/1980 |
| JP | 02018375 | 1/1990 |
| JP | 2120292 | 5/1990 |
| JP | 02233578 | 9/1990 |
| JP | 07221038 | 8/1995 |

OTHER PUBLICATIONS

Kawase et al. "Low Dislocation Density 6–Inch Diametar GaAs single Crystals Grown By the VCZ Method", Gallium Arsenide and Related Compounds, Karuizawa, Sep. 28–Oct. 2, 1992, No. SYMP, 19, Sep. 28, 1992, pp. 13–18.

Kuma et al. "Growth and Characterization of Huge GaAs Crystals", Gallium Arsenide and Related Compounds, Freiburg, Aug. 29–Sep. 2, 1993, No. SYMP. 20, 29 Aug., 1993, pp. 497–504.

"Growth and Characterization of Single Crystels of PbTe–SnTe", by John W. Wagner et al., Transactions of the Metallurgical Society of AIME, vol. 242, (1968), pp. 366–371.

(List continued on next page.)

Primary Examiner—Duy-Vu N. Deo
(74) Attorney, Agent, or Firm—W. F. Fasse; W. G. Fasse

(57) ABSTRACT

A large semiconductor crystal has a diameter of at least 6 inches and a low dislocation density of not more than $1\times10^4$ cm$^{-2}$. The crystal is preferably a single crystal of GaAs, or one of CdTe, InAs, GaSb, Si or Ge, and may have a positive boron concentration of not more than $1\times10^{16}$ cm$^{-3}$ and a carbon concentration of $0.5\times10^{15}$ cm$^{-3}$ to $1.5\times10^{15}$ cm$^{-3}$ with a uniform concentration throughout the crystal. Such a crystal can form a very thin wafer with a low dislocation density. A special method and apparatus for producing such a crystal is also disclosed.

14 Claims, 16 Drawing Sheets

U.S. PATENT DOCUMENTS

| | | | |
|---|---|---|---|
| 4,609,530 A | * 9/1986 | Morioka et al. | 252/62.3 GA |
| 4,704,257 A | 11/1987 | Tomizawa et al. | |
| 5,057,287 A | 10/1991 | Swiggard | |
| 5,074,953 A | 12/1991 | Shirata et al. | |
| 5,096,677 A | 3/1992 | Katsuoka et al. | |
| 5,132,145 A | 7/1992 | Valentian | |
| 5,196,173 A | 3/1993 | Arai et al. | |
| 5,210,052 A | * 5/1993 | Takasaki | 438/509 |
| 5,256,381 A | * 10/1993 | Tada et al. | 117/213 |
| 5,290,395 A | * 3/1994 | Matsumoto et al. | 117/18 |
| 5,566,433 A | * 10/1996 | Love et al. | 26/2 R |
| 5,685,907 A | 11/1997 | Fujikawa et al. | |
| 6,254,677 B1 | 7/2001 | Hashio et al. | |
| 6,693,021 B1 | * 2/2004 | Motoki et al. | 438/481 |

OTHER PUBLICATIONS

"Effect of Ultrasonic Vibrations on InSb Pulled Crystals", by Yasuhiro Hayakawa et al., Japanese Journal of Applied Physics, vol. 21, No. 9 (1982), pp. 1273–1277.

"Melt–Growth of III–V Compounds by the Liquid Encapsulation and Horizontal Growth Techniques"; by J.B. Mullin; III–V Semiconductor Materials and Devices, Elsevier Science Publishers B.V.,1989, pp. 10 to 12.

1995 Tohoku University, Master's Thesis (Yuta Hino), "Distribution Equilibrium of Oxygen Between Molten Group III Metal and $B_2O_3$ Flux", Fig. 3–1.

* cited by examiner

LARGE SIZE SEMICONDUCTOR CRYSTAL WITH LOW DISLOCATION DENSITY

CROSS-REFERENCE TO RELATED APPLICATIONS

This application is a Divisional of U.S. application Ser. No. 09/779,097, filed Feb. 7, 2001, now U.S. Pat. No. 6,572,700, issued Jun. 3, 2003, which, in turn is a Continuation-in-part of U.S. application Ser. No. 09/217,349, filed Dec. 21, 1998, now U.S. Pat. No. 6,254,677, issued Jul. 3, 2001.

BACKGROUND OF THE INVENTION

1. Field of the Invention

The present invention relates to a semiconductor crystal, and a method and apparatus of producing the same. Particularly, the present invention relates to a semiconductor crystal for use in production of a GaAs substrate and the like employed in an optical device, an electronic device, and the like, and a method and apparatus of producing such a semiconductor crystal.

2. Description of the Background Art

A GaAs crystal, for example, among the semiconductor crystals, is produced industrially by the pulling method (LEC (liquid Encapsulated Czochralski) method), the horizontal boat method (HB (Horizontal Bridgman) method, HGF (Horizontal Gradient Freeze) method), and the vertical boat method (VB (Vertical Bridgman) method, VGF (Vertical Gradient Freeze) method). The pulling method and the vertical boat method are particularly advantageous over the horizontal boat method for producing a single crystal since the yield is improved due to the cross section of the obtained crystal being circular identical to that of the substrate and since the diameter can easily be increased due to the symmetry of the growing crystal.

As an example of an apparatus of producing a semiconductor crystal an apparatus having a carbon heater and a crucible that stores material melt placed in a stainless steel-made high pressure chamber is known. Such an apparatus is used in the LEC, the VB, or the VGF method.

FIG. 14 shows an example of such an apparatus using a stainless steel-made high pressure chamber. A cross sectional view of a schematic structure of an apparatus of producing a semiconductor crystal employed in the pulling method is shown.

Referring to FIG. 14, the apparatus includes a crucible 2 supported by a lower shaft 4, and a carbon heater 3 in a stainless steel high pressure chamber 11. A heat insulator 5 is provided between carbon heater 3 and stainless steel high pressure chamber 11 to prevent damage of chamber 11 caused by the heat of carbon heater 3.

In growing a crystal using such an apparatus, crucible 2 is first filled with GaAs material to prepare material melt 60 by the heat from carbon heater 3. The surface of material melt 60 is encapsulated by a liquid encapsulation material 70 in order to prevent evaporation of As from material melt 60. A pull shaft 14 having a seed crystal 55 attached at the leading end is pulled upward as indicated by the arrow to effect crystal growth under a high pressure atmosphere. Thus, a GaAs single crystal 50 is obtained.

FIG. 15 shows another example of an apparatus employing a stainless steel high pressure chamber. A cross sectional view of a schematic structure of an apparatus of producing a semiconductor crystal employed in the vertical boat method such as the VB or VGF method is shown.

Referring to FIG. 15, the apparatus has seed crystal 55 placed at the lower portion of crucible 2. By moving lower shaft 4 downwards as indicated by the arrow or by shifting the temperature distribution, material melt 60 is solidified from seed crystal 55 sequentially upwards for crystal growth. The remaining structure is similar to that of the apparatus of FIG. 14. Therefore, description thereof will not be repeated.

As another example of an apparatus for crystal growth, an apparatus is known having a crucible or boat that stores material melt sealed in vacuum in a quartz ampoule, which is heated from the outer side. Such an apparatus is used in the horizontal boat method including the HB or HGF method, and in the vertical boat method including the VB or VGF method.

FIG. 16 is a sectional view showing a schematic structure of such an apparatus employing a quartz ampoule.

Referring to FIG. 16, the apparatus has crucible 2 sealed within a quartz ampoule 21. A heater 3 such as of kanthal is provided outside ampoule 21. Quartz ampoule 21 is supported by lower shaft 4. A crystal is grown by moving lower shaft 4 downwards as indicated by the arrow or by shifting the temperature distribution.

As a method of synthesizing the GaAs material for crystal growth, the As injection method of effecting reaction between the Ga in the crucible and the arsenic vapor generated by controlling the temperature of the As source outside the crucible, and the method of charging both the Ga and the As into the crucible together and raising the temperature for a direct reaction are known. Both methods are carried out in a high pressure chamber under liquid encapsulation. It is particularly noted that the latter requires high pressure of several ten atmospheres since the arsenic vapor pressure becomes considerably high.

Production of a GaAs polycrystal is carried out by cooling the material obtained as described above. Production of a single crystal is carried out by the method of charging the prepared polycrystal into a crucible as the material, and the method of growing a single crystal subsequent to the raw material synthesization.

There is the demand for a larger semiconductor crystal as the integration density of a semiconductor device becomes higher. Currently, a GaAs, crystal with 4 inches in diameter is of practical usage for a compound semiconductor crystal. The need of increasing the size of such a compound semiconductor crystal has become greater to induce various research and development. However, there are many problems on the mass production of a large compound semiconductor crystal. Production of a large compound semiconductor crystal greater than 4 inches is not yet practical.

For example, when the stainless steel high pressure chamber shown in FIG. 14 or FIG. 15 is used, a heat insulating layer must be inserted between the heater and the stainless steel chamber. Accordingly, the size of the furnace becomes larger to increase the furnace cost.

According to the method shown in FIG. 14 or FIG. 15, carbon is employed for the heater material. Heating up to a temperature as high as approximately 1300° C. is required in preparing the material melt since the melting point of GaAs is 1238° C. Here, the vapor pressure of carbon is small even at the high temperature of approximately 1300° C. Therefore, carbon is suitable to be used for the heater. However, carbon is an element that is electrically active in a GaAs semiconductor single crystal. Therefore, the concentration of the carbon must be controlled in order to obtain a single crystal of high quality. When the method employing the stainless steel high pressure chamber shown in FIG. 14 or FIG. 15 is to be carried out, various measures must be taken to control the electrical properties of GaAs crystal since the carbon and the synthesized GaAs reside in the same spacing. Thus, there is a problem that the furnace cost is increased.

In the case where the quartz ampoule shown in FIG. 16 is used, there was a problem that it is difficult to produce a large crystal by charging a great amount of the material since there is a possibility of deformation or breakage of the ampoule. There is also a problem that the material cannot be synthesized, in situ, since the ampoule is sealed, barring the application of the As injection method. There is also the problem that the atmospheric gas cannot be controlled after the ampoule is sealed.

Japanese Patent Laying-Open No. 7-221038 discloses an example of using silicon carbide in the annealing furnace of a semiconductor. However, this publication is silent about the advantage of using such an apparatus in the growth of a single crystal.

Japanese Patent Laying-Open No. 2-233578 discloses an apparatus of growing a semiconductor single crystal such as GaAs according to the pulling method with the entire apparatus placed in a stainless steel chamber. This apparatus is characterized in that a solid gasket is used as the heat-proof sealing material since the chamber made of silicon carbide is subjected to high temperature. However, the heat-proof sealing member has poor airtightness, so that sufficient difference between the inside pressure and the outside pressure cannot be achieved.

Japanese Patent Laying-Open No. 2-120292 discloses an embodiment that employs silicon carbide for the crucible. However, this publication is completely silent about using silicon carbide for the reactor tube.

Thus, the need of a large GaAs semiconductor single crystal with at least 6 inches in diameter has become greater in response to the semiconductor device scaled to higher integration density. A semiconductor crystal of a high quality is required at low cost.

SUMMARY OF THE INVENTION

In view of the foregoing, an object of the present invention is to provide a semiconductor crystal such as GaAs that meets the requirement of high quality and large size, and a semiconductor crystal substrate using the same.

Another object of the present invention is to provide a method and apparatus of producing such a semiconductor crystal at low cost.

According to an aspect of the present invention, an apparatus of producing a semiconductor crystal is provided. The apparatus includes a reactor tube having at least one open end, said reactor tube including any one material selected from the group consisting of silicon carbide, silicon nitride, aluminum oxide, or a composite material including any one base material selected from the group consisting of silicon carbide, silicon nitride, aluminum nitride, boron nitride, aluminum oxide, magnesium oxide, mullite, and carbon as a base, and including an oxidization-proof or airtight film formed on the surface of the base; a heater arranged around and external to the reactor tube under atmospheric pressure in an ambient air atmosphere; a flange attached at the open end to seal the reactor tube; and a crucible mounted in the reactor tube adapted to receive therein a first raw material of the semiconductor crystal. The reactor tube is capable of withstanding an internal pressure of greater than 1 atmosphere while the exterior of the reactor tube is under atmospheric pressure in the ambient air atmosphere. The apparatus further includes a seal member arranged to seal a junction between the flange and the open end of the reactor tube, and a temperature maintenance system for maintaining the temperature of the seal member and the junction between the flange and the open end of the reactor tube. The seal member is an elastic member.

In the present specification, "mullite" refers to a mixture of aluminum oxide and silicon oxide.

As "oxidation-proof or airtight film", a thin film and the like such as of silicon carbide, silicon nitride, aluminum nitride, aluminum oxide, or silicon oxide can be enumerated. Such a film can be formed by a coat on a base.

As "reactor tube of composite material", a reactor tube having the above-described oxidation-proof or airtight film coat on the surface of a base formed of carbon such as graphite, or having the surface of the silicon carbide base oxidized can be used. Alternatively, a reactor tube having the oxidation-proof ability improved by forming a thin film of silicon oxide on the surface of the base by coating can be used.

In the present invention, the temperature of the elastic member is preferably maintained at not more than 400° C., more preferably at not more than 300° C., and further preferably at not more than 200° C.

In the present invention, the elastic member is preferably rubber or fluorine-contained polymer.

In the present invention, the temperature maintenance system preferably includes an air-cooling arrangement around the junction.

In the present invention, the temperature maintenance system included a heat insulator arranged between the heater and the junction. At least one heat insulator is provided. The heat insulator is preferably arranged inside the reactor tube.

In the present invention, a cooling member is preferably arranged in close proximity to and/or around the junction.

In the present invention, the cooling member is preferably a fin.

In the present invention, the cooling member according to cooled gas in the present invention is preferably arranged in close proximity to and/or around the junction.

In the present invention, the temperature maintenance system preferably includes a cooling water jacket arranged in close proximity to and/or around the junction.

In the present invention, the semiconductor crystal is preferably a GaAs crystal.

In the present invention, the semiconductor crystal also includes a silicon semiconductor, a germanium semiconductor, and the like, in addition to the compound semiconductor such as GaAs, CdTe, InAs, GaSb, and the like. Also, it is assumed that the semiconductor crystal includes a single crystal or a polycrystal.

In the present invention, the internal pressure in the reactor tube is preferably maintained to be higher than the atmospheric pressure, and the ambient pressure outside the reactor tube is preferably the atmospheric pressure.

In the present invention, the apparatus preferably includes a reservoir arranged in the reactor tube above the crucible, and a pipe that extends downward from the reservoir into the crucible. The reservoir is adapted to receive a second raw material of the semiconductor crystal. The pipe is adapted to introduce a gas of the second raw material into the first raw material in the crucible through the pipe.

In the present invention, the first raw material received in the crucible is preferably Ga, and the second raw material received in the reservoir is preferably As.

The apparatus of the present invention preferably includes a shaft member that extends through the flange at a lower end of the reactor tube and is connected to the crucible.

In the present invention, the reactor tube is preferably arranged in a vertical direction. The shaft member can move the crucible upwards and downwards in the reactor tube.

The apparatus of the present invention preferably includes at least one temperature measurement member arranged inside the reactor tube in close proximity to the crucible.

According to another aspect of the present invention, a method of producing a semiconductor crystal is provided. This method includes the steps of: a) charging the first raw material into the crucible in the reactor tube; b) attaching the flange at the open end to seal the reactor tube; c) maintaining the interior of the reactor tube under an inert gas atmosphere at an inner pressure greater than the atmospheric pressure; d) forming a material melt in the crucible by heating the reactor tube using the heater; and growing the semiconductor crystal by solidifying the material melt.

In the present invention, the step of growing the semiconductor crystal preferably employs any crystal growth method selected from the group consisting of a VB method, a VGF method and a pulling method.

In the present invention, the semiconductor crystal is preferably a GaAs crystal. The step a) includes the steps of: filling the crucible with Ga; filling a reservoir with As; and placing the crucible filled with Ga and the reservoir filled with As in the reactor tube. The step d) includes the steps of: heating the Ga in the crucible up to a temperature higher than the melting point of GaAs by the heater; heating and sublimating the As in the reservoir by the heater to produce arsenic vapor; and introducing the arsenic vapor into the Ga via a pipe from the reservoir to form a GaAs melt in the crucible.

In the present invention, the step of growing the semiconductor crystal uses any crystal growth method selected from the group consisting of a VB method, a VGF method and a pulling method.

In the present invention, the heater is preferably a resistance heater.

In the present invention, the primary component of the heater is preferably iron.

In the present invention, the heater is preferably externally unshielded and the apparatus includes no shield externally around the heater.

In the present invention, the reactor tube is capable of withstanding a temperature of at least 1250° C.

In the present invention, the reactor tube is capable of withstanding an internal pressure of 2 atmospheres in gauge pressure when the reactor tube is at the temperature of at least 1250° C.

In the present invention, the step of heating the GaAs in the crucible includes raising the temperature to at least 1250° C.

The apparatus of producing a semiconductor crystal of the present invention is characterized in that a reactor tube is included formed of any one material selected from the group consisting of silicon carbide, silicon nitride, aluminum nitride, and aluminum oxide, or of a composite material with any one of a material selected from the group consisting of silicon carbide, silicon nitride, aluminum nitride, boron nitride, aluminum oxide, magnesium oxide, mullite, and carbon as the base, and having an oxidation-proof or airtight Mm formed on the surface of the base. Therefore, the possibility of deformation or breakage of the reactor tube such as in the case of using the conventional quartz ampoule is eliminated. A large amount of the material can be charged to produce a crystal of a large size.

The usage of a reactor tube formed of silicon carbide is advantageous in that the cost is lower than that of the conventional stainless steel high pressure chamber. Therefore, the furnace cost in producing a semiconductor crystal according to the present invention can be lowered considerably.

When a reactor tube formed of silicon nitride, formed of aluminum nitride, formed of aluminum oxide, or formed of a base that does not include carbon such as silicon nitride, aluminum nitride, boron nitride, aluminum oxide, magnesium oxide, mullite, and the like is used, introduction of carbon into the semiconductor material can be prevented. As a result, a semiconductor material of high purity can be achieved.

Even in the case where a base is used of a carbon material such as graphite that is not oxidation-proof, or a porous aluminum oxide or mullite that is not airtight, damage or fracture of the reactor tube can be prevented effectively by coating the surface of the base with oxidation-proof or airtight material. Since the material corresponding to such a base is extremely economical, a semiconductor crystal can be obtained at low cost according to the present invention.

Even in the case where a base including carbon such as silicon carbide or graphite is used, introduction of carbon into the semiconductor material can be prevented by coating the surface with a material that does not include carbon. In the case where a base of low purity such as mullite is used, a semiconductor crystal of high purity can be achieved by coating the surface with a material of high purity.

According to the present invention, the reactor tube has an open end in at least one end portion. A flange is attached at this open end. Therefore, the reactor tube can be used repeatedly, opposed to the case where the conventional quartz ampoule is used. Accordingly, the production cost can be reduced.

Since a temperature measurement member is also provided in the proximity of the crucible, crystal growth of high reproducibility can be carried out.

In contrast to the case where the ampoule is sealed, the material can be synthesized in situ. Application to the As injection method is allowed. Also, the partial pressure of the atmospheric gas within the chamber can be controlled in situ to facilitate adjustment of the impurity concentration.

According to the present invention, a semiconductor single crystal where the deviation of the carbon concentration in the direction of the length is extremely small can be obtained.

The semiconductor crystal of the present invention has a diameter of at least 6 inches. The average dislocation density is not more than $1 \times 10^4$ cm$^{-2}$. The defect density is extremely low.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
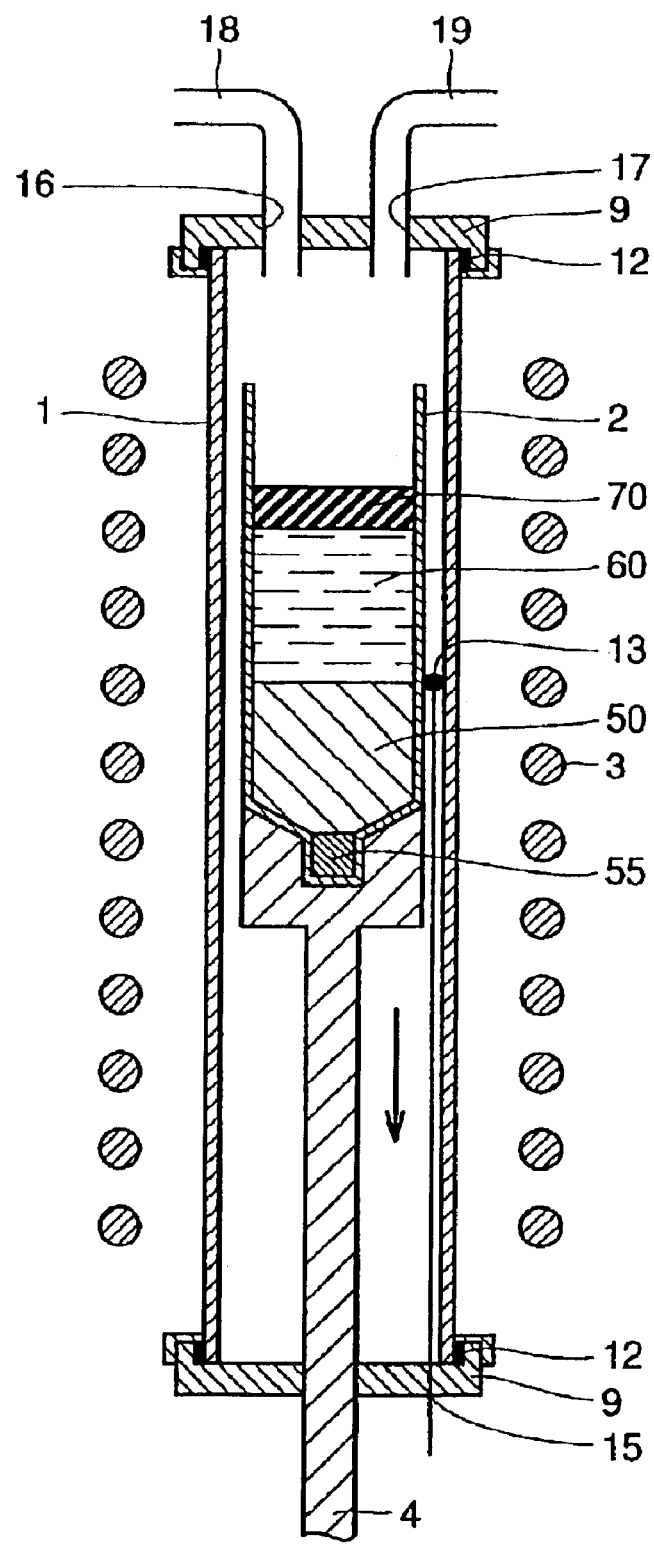
FIG. 1 is a sectional view showing a schematic structure of an apparatus of producing a semiconductor crystal according to a first embodiment of the present invention.
Figure 2:
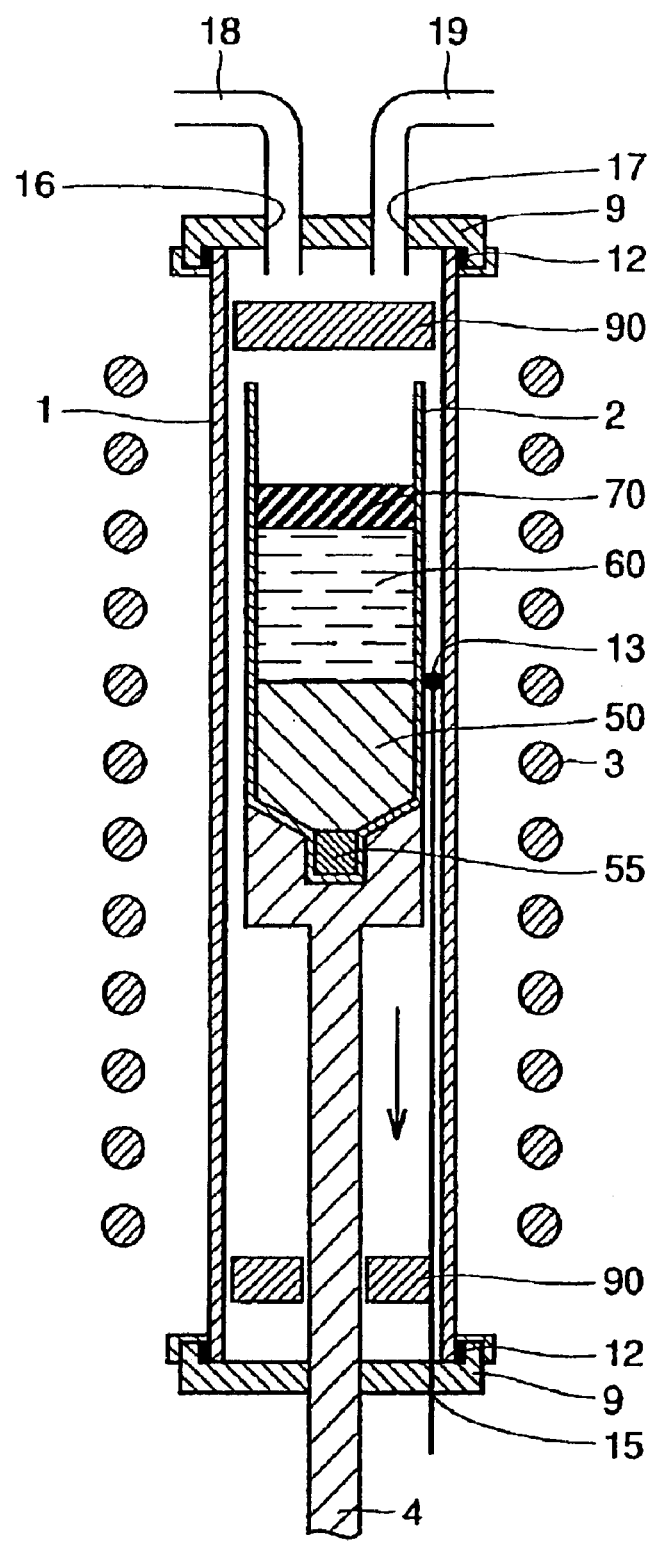
FIG. 2 is a sectional view showing a schematic structure of an apparatus of producing a semiconductor crystal, having a heat insulator arranged at the inner side of the reactor tube between the heating portion by the reactor tube heat means and the junction of the flange and the reactor tube open end according to the first embodiment of the present invention.
Figure 3:
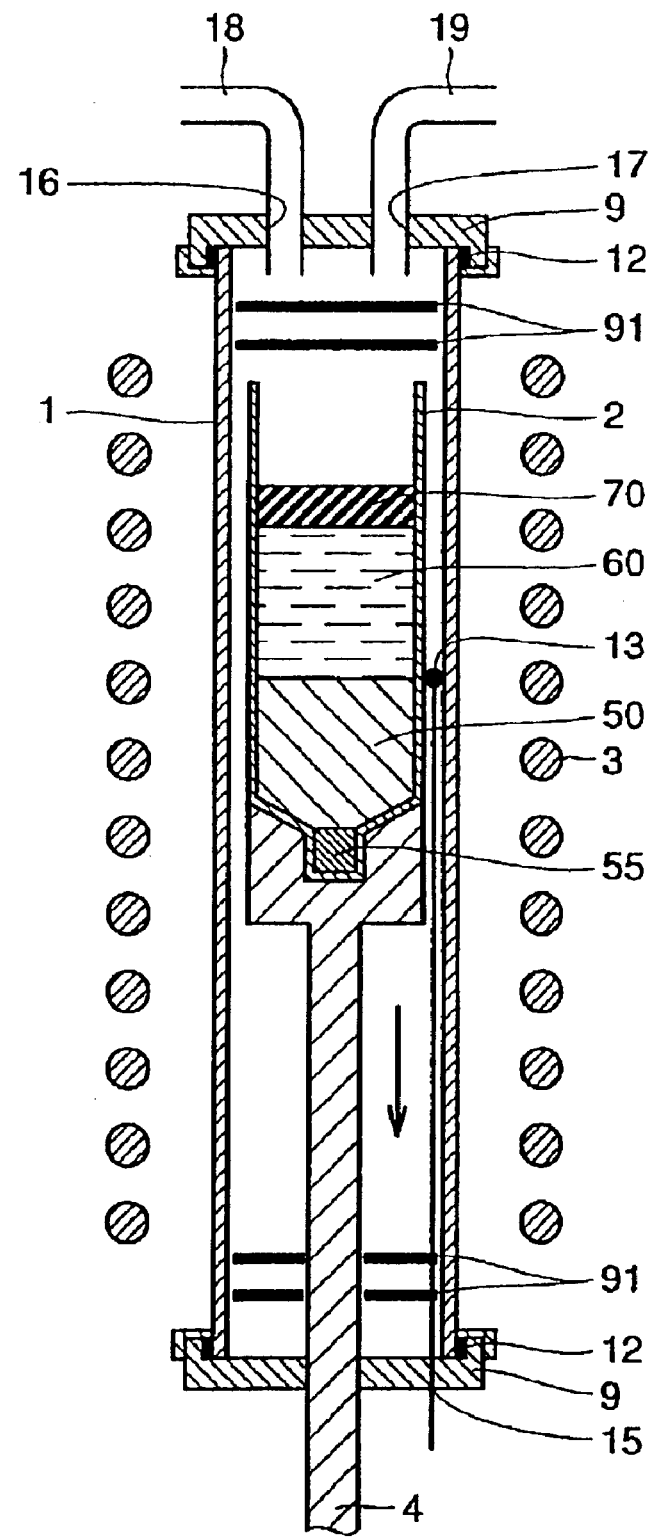
FIG. 3 is a sectional view showing a schematic structure of an apparatus of producing a semiconductor crystal, having a reflector plate arranged at the inner side of the reactor tube between the heating portion by the reactor tube heat means and the junction of the flange and the reactor tube open end according to the first embodiment of the present invention.
Figure 4:
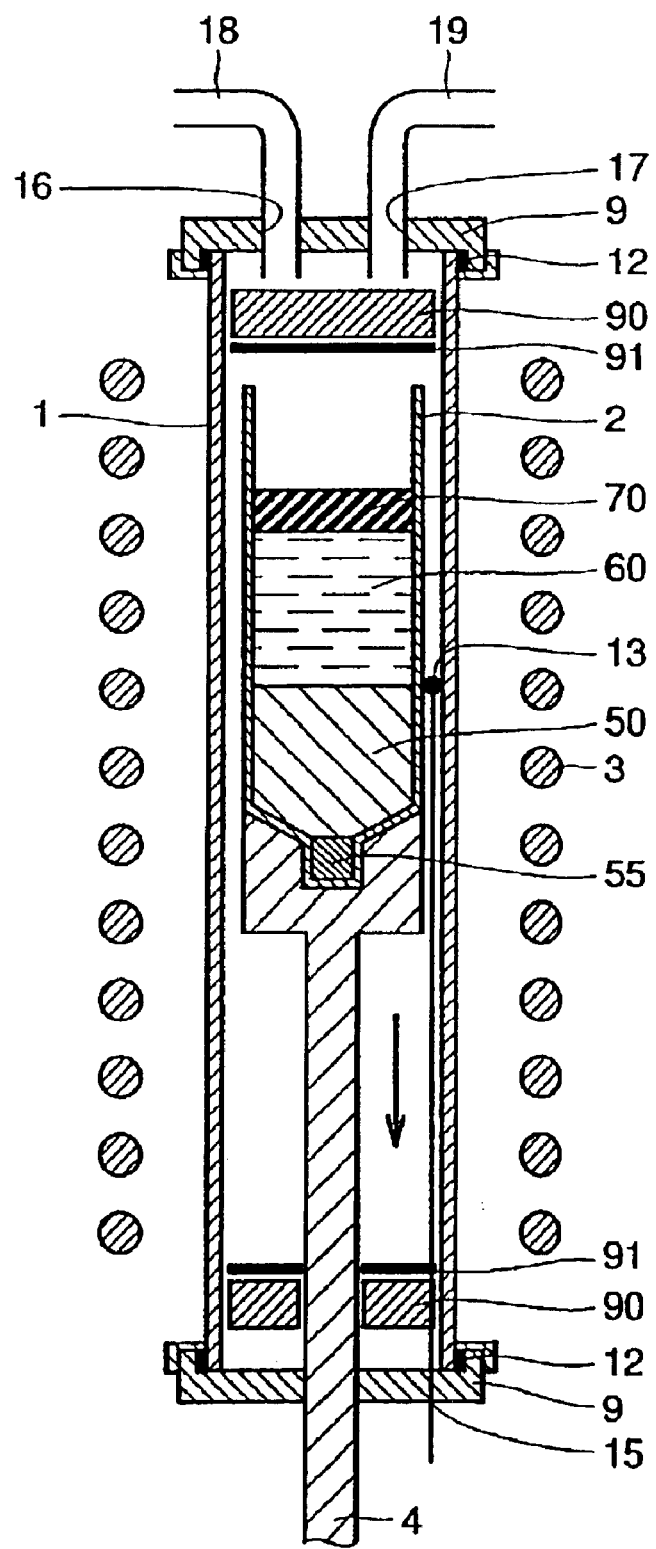
FIG. 4 is a sectional view showing a schematic structure of an apparatus of producing a semiconductor crystal, having a heat insulator and a reflector plate arranged together at the inner side of the reactor tube between the heating portion by the reactor tube heat means and the junction of the flange and the reactor tube open end according to the first embodiment of the present invention.

The practical method of producing GaAs is mainly classified into the pulling method (LEC method) and the boat method (VB method) as mentioned before. The method of the present invention can be employed in both methods. Specifically, an example of the VB method is shown in the first embodiment, and an example of the LEC method is shown in the third embodiment. It is to be noted that the present invention is applicable, not only in the production of a semiconductor single crystal, but also in the synthesization of a semiconductor material such as a GaAs polycrystal that becomes the material thereof. For example, a pulverized version of the GaAs polycrystal compact obtained in the second embodiment can be used as the material in the first or third embodiment. In the first and third embodiments, seed crystal is used. However, in the second embodiment, seed crystal is not used.

The advantage of the present invention is most appreciable when a semiconductor single crystal is grown by the VB method. According to the present invention, a semiconductor crystal at least 6 inches in diameter with the average dislocation density of not more than $1 \times 10^4$ $cm^{-2}$ can easily be obtained. By controlling the cooling method and the like, a semiconductor crystal having an average dislocation density of approximately 1 to $5 \times 10^3$ $cm^{-2}$ can be grown. The electrical property can be made uniform by such a low dislocation density.

Furthermore, according to the present invention, a semiconductor crystal with the concentration of boron (B) less than $3 \times 10^{16}$ $cm^{-3}$, preferably not more than $1 \times 10^{16}$ $cm^{-3}$ can be grown. It is said that boron (B) reduces the activation factor after ion implantation. Therefore, the device performance can be improved by reducing the concentration of boron (B).

The semiconductor crystal of the present invention has a low residual strain since the occurrence of dislocation is low. Therefore, the strength sufficient for practical usage can be achieved with the thickness of 500–700 $\mu$m even when the size becomes greater. The average residual strain of the substrate measured using the photoelastic effect is not more than $1 \times 10^{-5}$.

The semiconductor crystal of the present invention as an ingot is characterized in that the deviation of the carbon concentration in the direction of the length is extremely small. In other words, the carbon (C) concentration distribution can be made uniform along the direction of the length by controlling the concentration of the CO gas in the reactor tube. According to the present invention, a compound semiconductor single crystal ingot can be obtained that has a diameter of at least 6 inches, the average dislocation density of less than $1 \times 10^4$ $cm^{-1}$, and having the carbon concentration restricted to be within ±50% with respect to the target value over the region of 0.1–0.8 in fraction solidified. In other words, when the carbon concentration is set to $1 \times 10^{15}$ $cm^{-3}$, for example, the carbon concentration of the actually obtained crystal has variation of the carbon concentration restricted within ±50% with respect to the set value over the entire length. Therefore, there is the advantage that the yield is improved when the substrate is cut out from this ingot. The reason why variation in the carbon concentration can be reduced by the present invention is due to the critical controllability of the concentration of the CO gas in the reactor tube during the growth. This advantage becomes more effective by selecting a material that does not include carbon for the reactor tube or by coating the reactor tube with a material that does not include carbon. Furthermore, a carbon heater is not used in the present invention in contrast to the case of crystal growth by the conventional high pressure chamber. This means that a crystal can be grown with the interior of the reactor tube under a carbon-free condition. Therefore, the distribution of the carbon concentration can be made uniform.

An example of producing a semiconductor crystal of 6 inches in diameter will be described hereinafter. However, the present invention is applicable to production of a semiconductor crystal of a larger size such as 8 inches.

First Embodiment

FIG. 1 is a sectional view of the schematic structure of an apparatus of producing a semiconductor crystal according to a first embodiment of the present invention.

Referring to FIG. 1, the apparatus includes a silicon carbide reactor tube 1 and a kanthal heater 3. Silicon carbide reactor tube 1 has an inner diameter of 170 mm and a thickness of 3 mm with an open end at both end sides. Kanthal heater 3 is arranged around reactor tube 1 in the atmosphere with 5 zones.

The first embodiment is characterized in that the heater is not externally shielded, as shown in FIG. 1. According to the conventional LEC method as disclosed in the aforementioned Japanese Patent Laying-Open No. 2-233578, a carbon heater of low reactivity was used to grow a crystal within a high pressure chamber. In contrast, the first embodiment of the present invention has a heater provided in the atmosphere outside the reactor tube. Therefore, a heater based on iron and the like that is low in cost can be used. This type of heater can easily provide multi zones. Therefore, favorable controllability of a temperature distribution can be provided. When a carbon heater is not used, a crystal can be grown with the interior of the silicon carbide reactor tube under a carbon-free state. Therefore, variation in the carbon concentration in the crystal can be reduced.

A stainless steel flange 9 is attached at both at the open ends of silicon carbide reactor tube 1.

Figure 5:
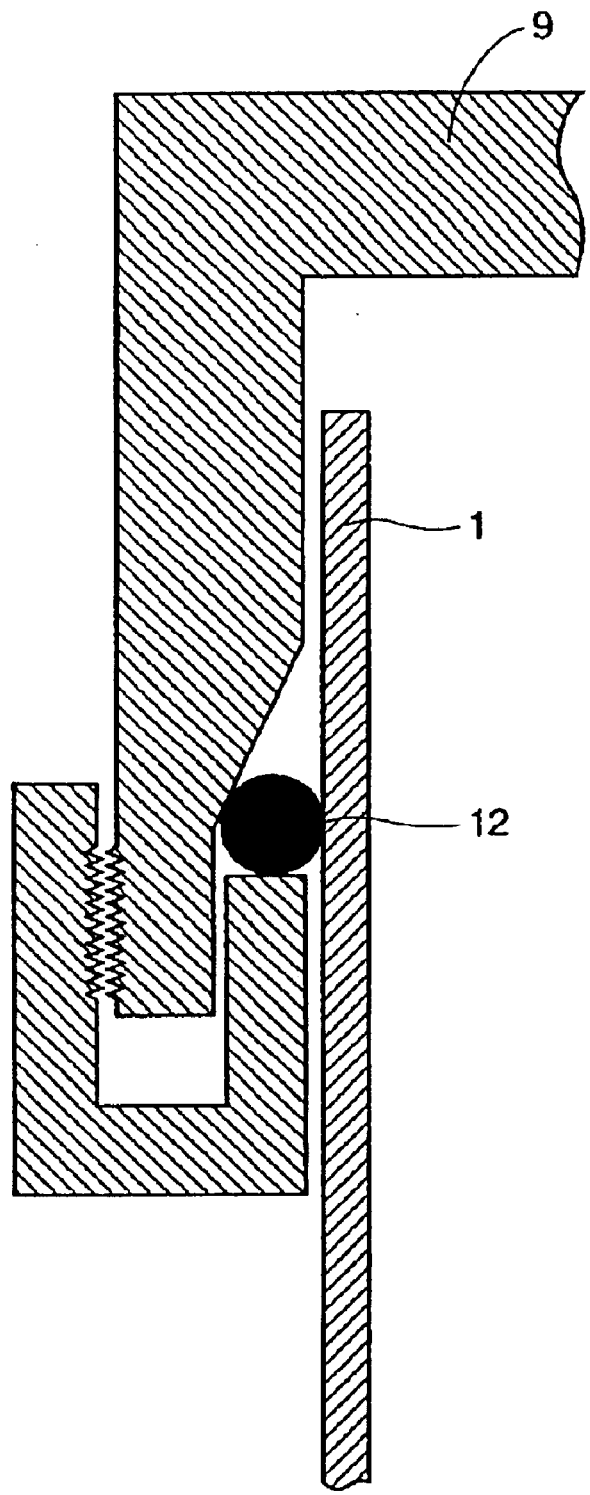
FIG. 5 is a partial sectional view showing in enlargement the junction portion between the reactor tube and the stainless steel flange of FIGS. 1 to 4.

FIG. 5 is a partial enlarged sectional view of the junction between silicon carbide reactor tube 1 and stainless steel flange 9.

Referring to FIG. 5, the junction portion of silicon carbide reactor tube 1 and stainless steel flange 9 has the Wilson seal structure with a packing 12 therebetween to ensure the airtightness. An elastic member such as an O-ring is used as packing 12. More specifically, fluorine-contained polymers and the like can be used as well as rubber. The range of selectivity for the material that can be used as packing 12 is wide. This is because, by the Wilson seal structure, there is no possibility of the material of packing 12 that is located outside silicon carbide reactor tube 1 (shown in FIG. 5) being incorporated as an impurity into the semiconductor crystal that is grown in reactor tube 1.

Since an elastic member such as of rubber or fluororesin is modified to lose its elasticity at high temperature, the elastic member is maintained preferably at not more than 400° C., more preferably at not more than 300° C., and further preferably at not more than 200° C. Although sufficient spacing may be provided between the junction and the heater so as to appropriately maintain the temperature of the elastic member, a heat insulator 90 or a reflector plate 91 can be provided between the junction and the heater inside the reactor tube to block heat more effectively, as shown in FIGS. 2, 3, 4, 9, 10 and 11. It is further advantageous to use heat insulator 90 and reflector plate 91 together, or use a plurality of reflector plates 91 in a layered manner. In the case where both heat insulator 90 and reflector plate 91 are used, either heat insulator 90 or reflector plate 91 may be disposed at the heater side. Alternatively, heat insulator 90 and reflector plate 91 may be provided in contact or not in contact.

In addition to metal such as stainless steel or molybdenum, ceramics such as silicon carbide, silicon nitride, aluminum nitride, boron nitride, aluminum oxide, magnesium oxide, mullite, or the like, and also quartz can be used for reflector plate 91. For heat insulator 90, an outer frame of carbon or boron nitride having an airtight coat applied at the outer surface filled with carbon fiber and/or carbon felt can be used. Alternatively, an outer frame of quartz or boron nitride filled with quartz wool can be used.

Figure 6:
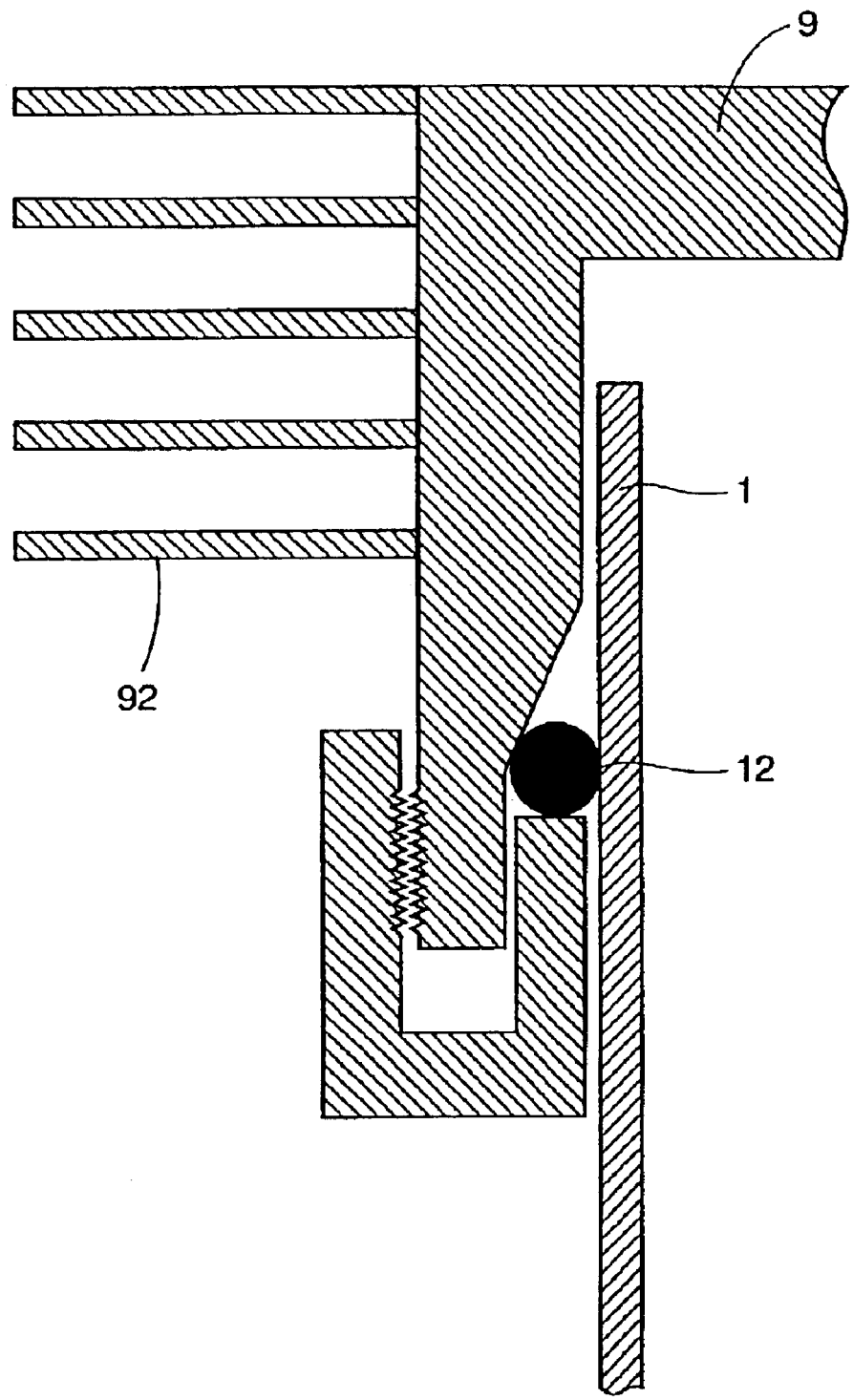
FIG. 6 is a partial sectional view showing in enlargement the manner of a cooling fin provided at the stainless steel flange of FIGS. 1 to 4.
Figure 7:
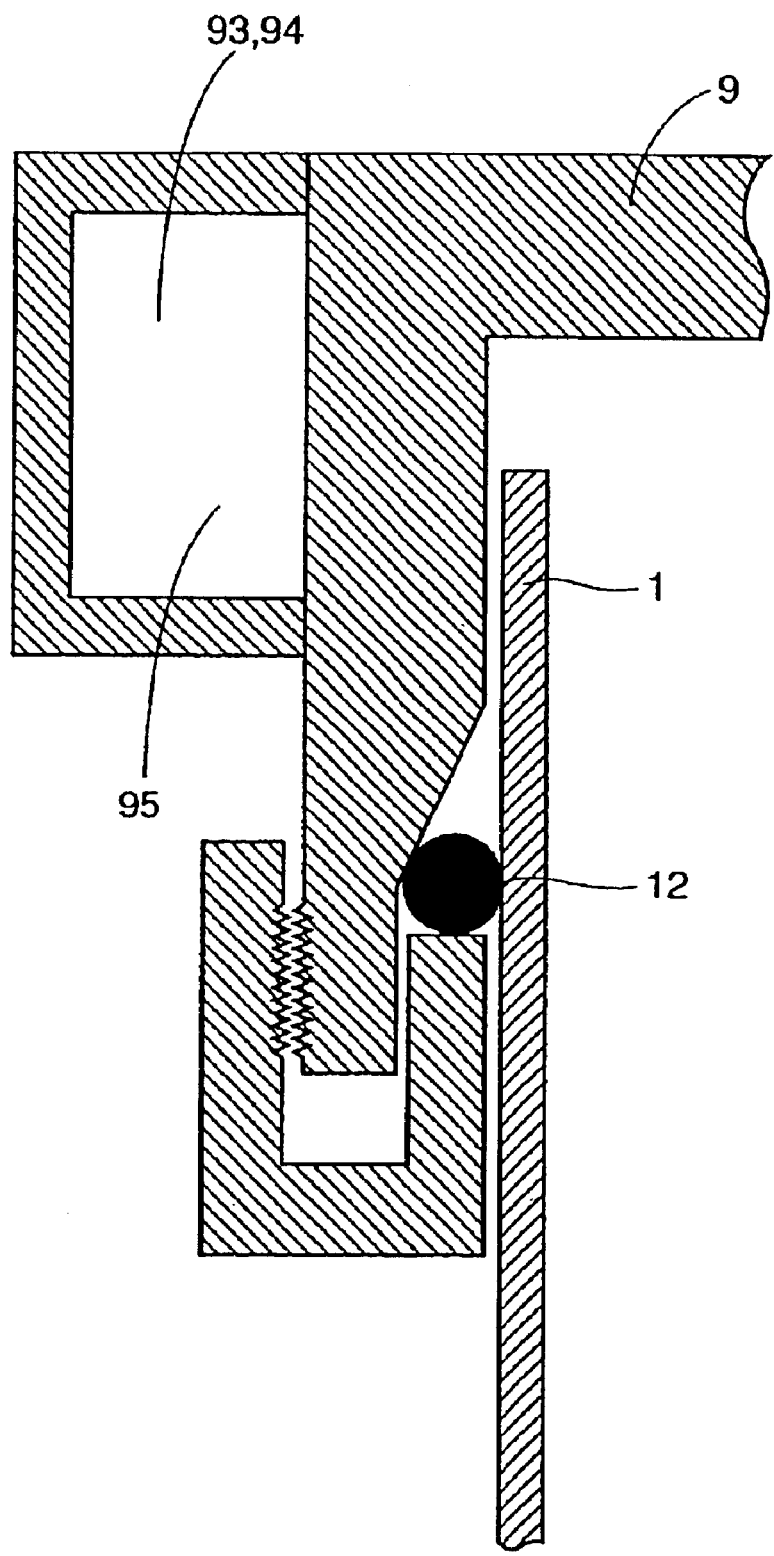
FIG. 7 is a partial sectional view showing in enlargement the manner of a jacket that conducts gas cooled by a compressor and the like or cooling water provided at the stainless steel flange of FIGS. 1 to 4.

It is further advantageous to provide cooling means such as a fin 92 at the outer side of the reactor tube or junction as shown in FIG. 6, or a jacket 95 of gas 93 cooled by a compressor or cooling water 94 as shown in FIG. 7 in the proximity and/or around the junction.

A port 16 for inserting an exhaust tube and a port 17 for inserting a gas inlet tube are provided in flange 9 attached at the upper portion of silicon carbide reactor tube 1. An exhaust tube 18 is inserted into port 16 to exhaust the interior of silicon carbide reactor tube 1 for vacuum. A gas inlet tube 19 is inserted in port 17 to introduce gas into silicon carbide reactor tube 1.

A lower shaft 4 that is movable upwards and downwards pierces the center of flange 9 that is attached at the lower portion of silicon carbide reactor tube 1. A crucible 2 to accommodate the material of the crystal is mounted at the leading end of lower shaft 4.

A thermocouple port 15 is formed at flange 9 attached to the lower portion of silicon carbide reactor tube 1. A thermocouple 13 to measure the temperature in the proximity of the side of crucible 2 is inserted into port 15. A thermocouple port can be formed at the upper flange to insert a thermocouple into the crucible from above. A thermocouple can be provided inside the lower shaft to measure the temperature at the bottom of the crucible. A radiation thermometer can be used as the temperature measurement means in addition to the thermocouple.

By using the apparatus of the above-described structure, a GaAs single crystal with 6 inches in diameter is produced by the VB method as set forth in the following.

First, a seed crystal of a GaAs single crystal is placed at the cap portion at the lower end of crucible 2 with 6 inches in diameter mounted at the leading end of lower shaft 4. Then, 20 kg of GaAs polycrystalline material and 300 g of $B_2O_3$ 70 to encapsulate the surface of material melt 60 are charged into crucible 2.

This crucible is installed within silicon carbide reactor tube 1. Flange 9 is attached for sealing. Then, silicon carbide reactor tube 1 is evacuated through exhaust pipe 18. The temperature is raised by kanthal heater 3. During the rise of the temperature, nitrogen gas is introduced into silicon carbide reactor tube 1 through gas inlet tube 19. The pressure in silicon carbide reactor tube 1 is adjusted to become approximately 2 atmospheres when the temperature is completely raised.

The GaAs polycrystalline material is melted by the heat of kanthal heater 3 to produce material melt 60. The temperature of the seed crystal is adjusted to be in the vicinity of 1238° C. that is the melting point of GaAs. Also, the temperature at the side surface of crucible 2 is adjusted to be approximately 1250° C. Then, lower shaft 4 is moved downwards as indicated by the arrow at the speed of 2 mm/h.

By effecting solidification from the seed crystal at the lower end of crucible 2 and gradually upward to material melt 60, a GaAs single crystal 50 is grown.

Second Embodiment

Figure 8:
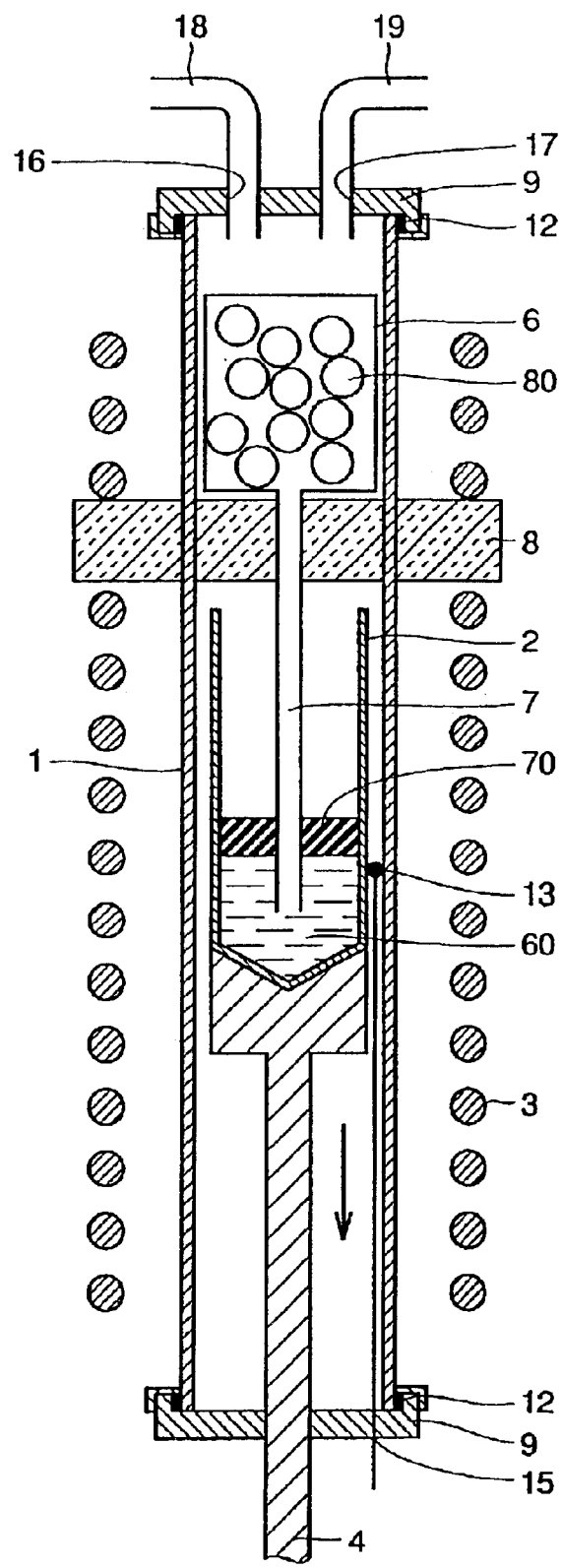
FIG. 8 is a sectional view showing a schematic structure of an apparatus of producing a semiconductor crystal according to a second embodiment of the present invention.
Figure 9:
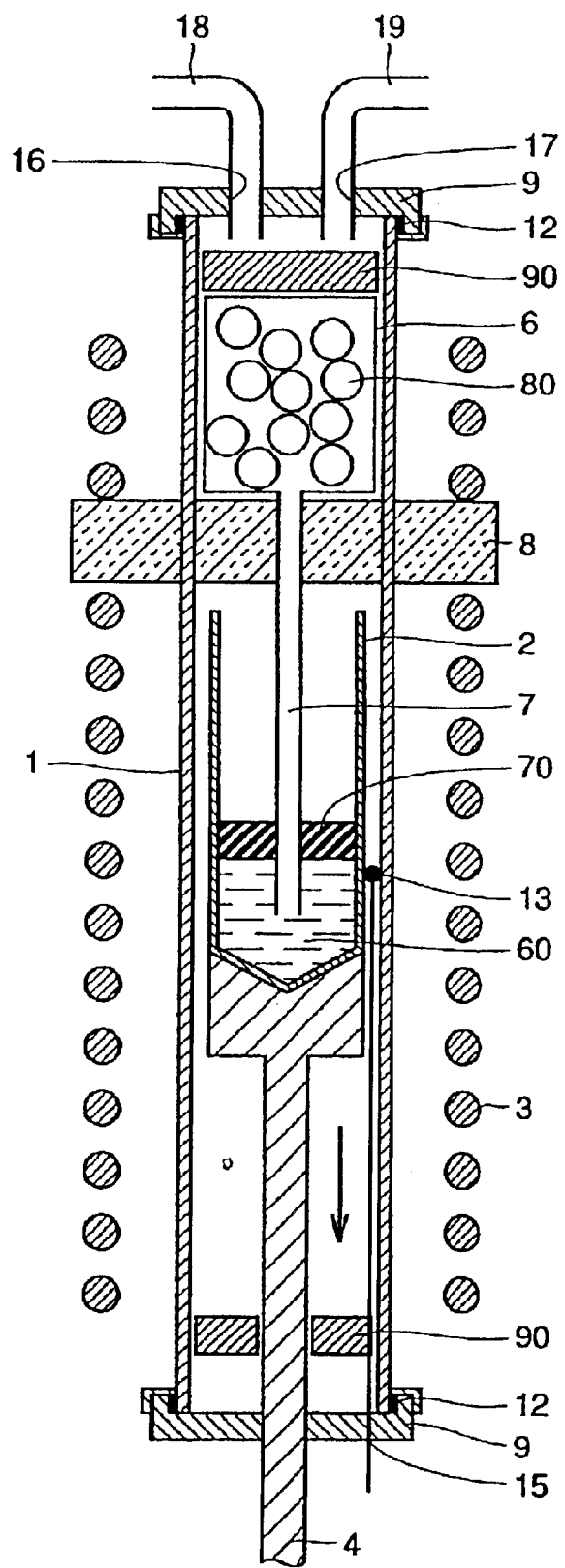
FIG. 9 is a sectional view showing a schematic structure of an apparatus of producing a semiconductor crystal, having a heat insulator arranged at the inner side of the reactor tube between the heating portion by the reactor tube heat means and the junction of the flange and the reactor tube open end according to the second embodiment of the present invention.
Figure 10:
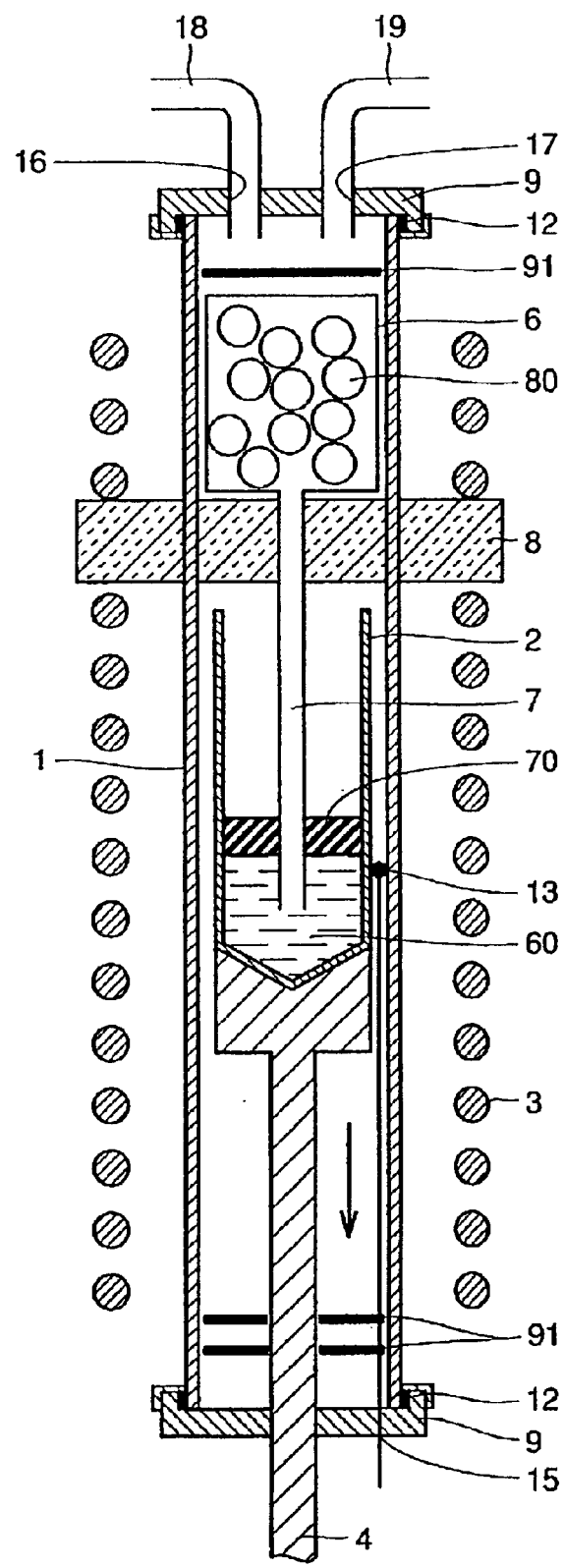
FIG. 10 is a sectional view showing a schematic structure of an apparatus of producing a semiconductor crystal, having a reflector plate arranged at the inner side of the reactor tube between the heating portion by the reactor tube heat means and the junction of the flange and the reactor tube open end according to the second embodiment of the present invention.
Figure 11:
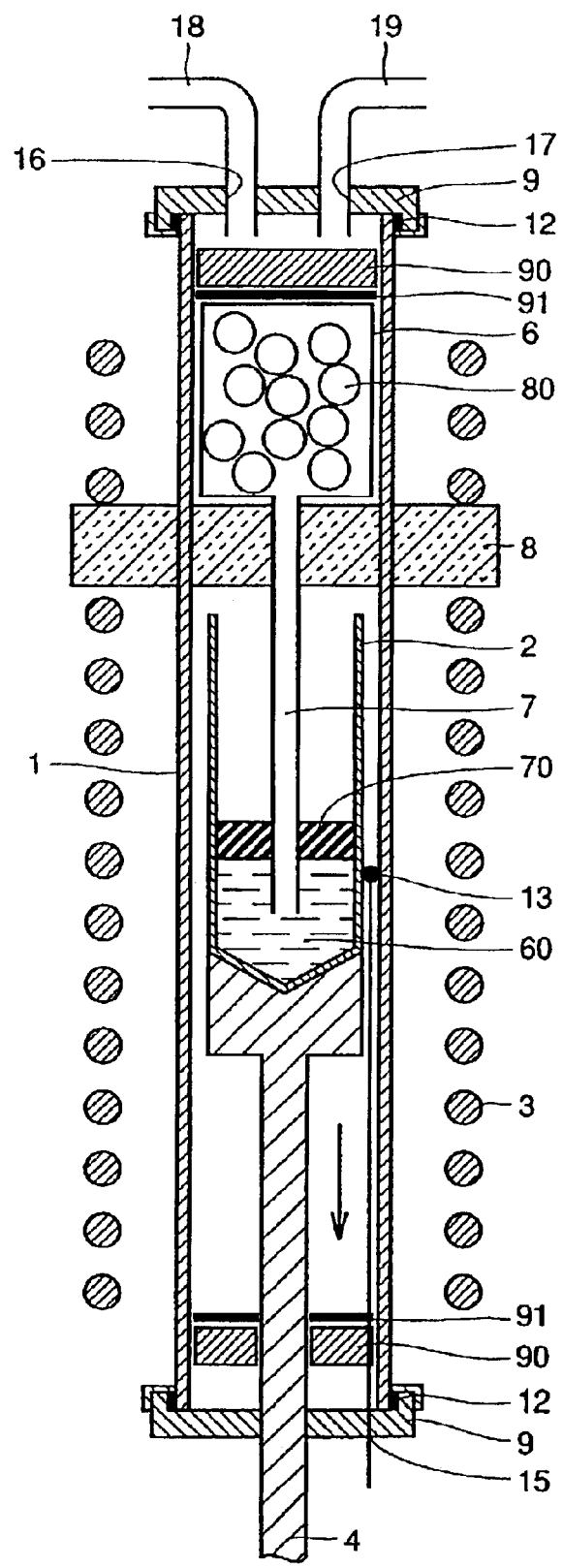
FIG. 11 is a sectional view showing a schematic structure of an apparatus of producing a semiconductor crystal, having a heat insulator and a reflector plate arranged together at the inner side of the reactor tube between the heating portion by the reactor tube heat means and the junction of the flange and the reactor tube open end according to the second embodiment of the present invention.

FIG. 8 is a sectional view showing a schematic structure of an apparatus of producing a semiconductor crystal according to a second embodiment of the present invention. The reactor tube of the second embodiment is formed of aluminum nitride.

Referring to FIG. 8, the apparatus has kanthal heater 3 of five zones divided into the upper one zone and the lower four zones by the interposition of a heat insulator 8. Heat insulator 8 is provided also inside aluminum nitride reactor tube 1 corresponding to the height of heat insulator 8 provided between the heater.

Crucible 2 is placed within aluminum nitride reactor tube 1 at the position lower than heat insulator 8. A reservoir 6 is placed in aluminum nitride reactor tube 1 at a position upper than heat insulator 8. A pipe 7 is connected to reservoir 6. Pipe 7 is formed so that the leading end is located in material melt 60 that is charged into crucible 2.

The remaining structure is similar to that of the apparatus of the first embodiment shown in FIG. 1. Therefore, description thereof will not be repeated.

Using an apparatus of the above-described structure, a GaAs polycrystal of 6 inches in diameter is produced by the VB method as set forth in the following.

14.5 kg of liquid Ga of high purity and 300 g of $B_2O_3$ 70 for encapsulating the surface of material melt 60 are charged into pBN crucible 2 with 6 inches in diameter mounted at the leading end of lower shaft 4. 15.5 kg of As 80 of high purity is charged into reservoir 6 located above heat insulator 8. The position of reservoir 6 and crucible 2 is adjusted so that pipe 7 connected to reservoir 6 and passing through a hole in heat insulator 8 has its leading end located in liquid Ga 60. This assembly is placed within aluminum nitride reactor tube 1. Sealing is effected by attaching flange 9.

Then, the interior of aluminum nitride reactor tube 1 is evacuated through exhaust tube 18. The temperature is raised by kanthal heater 3. The temperature of thermocouple 14 placed at the side of crucible 2 is adjusted to be approximately 1250° C. The temperature in reservoir 6 is adjusted to be kept below 500° C. During the rise of the temperature, nitrogen gas is introduced into aluminum nitride reactor tube 1 through gas inlet tube 19. The pressure in aluminum nitride reactor tube 1 is adjusted to be approximately 2 atmospheres at the completion of the temperature rise.

Then, the temperature in reservoir 6 is raised up to approximately 650° C. to generate arsenic vapor. By introducing the arsenic vapor into liquid Ga through pipe 7 for reaction, GaAs melt 60 is produced in crucible 2.

The temperature at the bottom of crucible 2 is adjusted to be in the vicinity of 1238° C. which is the melting point of GaAs, subsequent to the completion of the reaction for the formation of the GaAs melt. Then, lower shaft 4 is moved downwards as indicated by the arrow at the speed of 10 mm/h.

By solidifying material melt 60 sequentially from the bottom of crucible 2, GaAs polycrystal 50 is grown.

Third Embodiment

Figure 12:
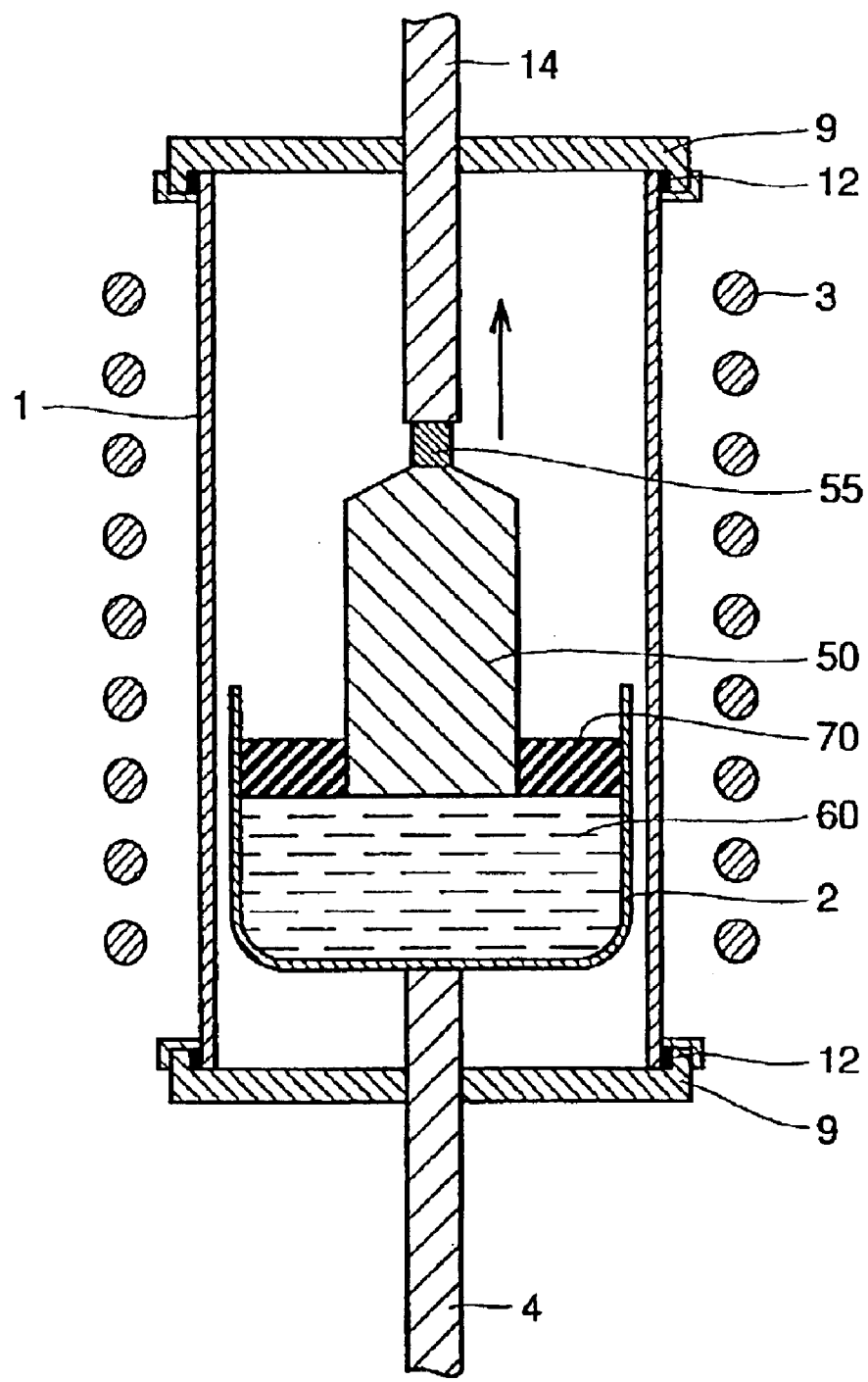
FIG. 12 is a sectional view showing a schematic structure of an apparatus of producing a semiconductor crystal according to a third embodiment of the present invention.

FIG. 12 is a sectional view showing a schematic structure of an apparatus of producing a semiconductor crystal according to a third embodiment of the present invention. The reactor tube of the present embodiment is formed of aluminum oxide.

The apparatus of FIG. 12 is mainly used in the pulling method. The apparatus includes an aluminum oxide reactor tube 1 having an open end at both end sides, and a heater 3 arranged around aluminum oxide reactor tube 1. A flange 9 is attached at both the open ends of aluminum oxide reactor tube 1.

Lower shaft 4 pierces the center of the flange 9 attached at the lower end of aluminum oxide reactor tube 1. Crucible 2 is mounted at the leading end of lower shaft 4. A pull shaft 14 that is movable upwards and downwards pierces the center of flange 9 attached at the upper portion of aluminum oxide reactor tube 1. A crystal is grown by drawing up pull shaft 4 in the direction of the arrow.

Figure 13:
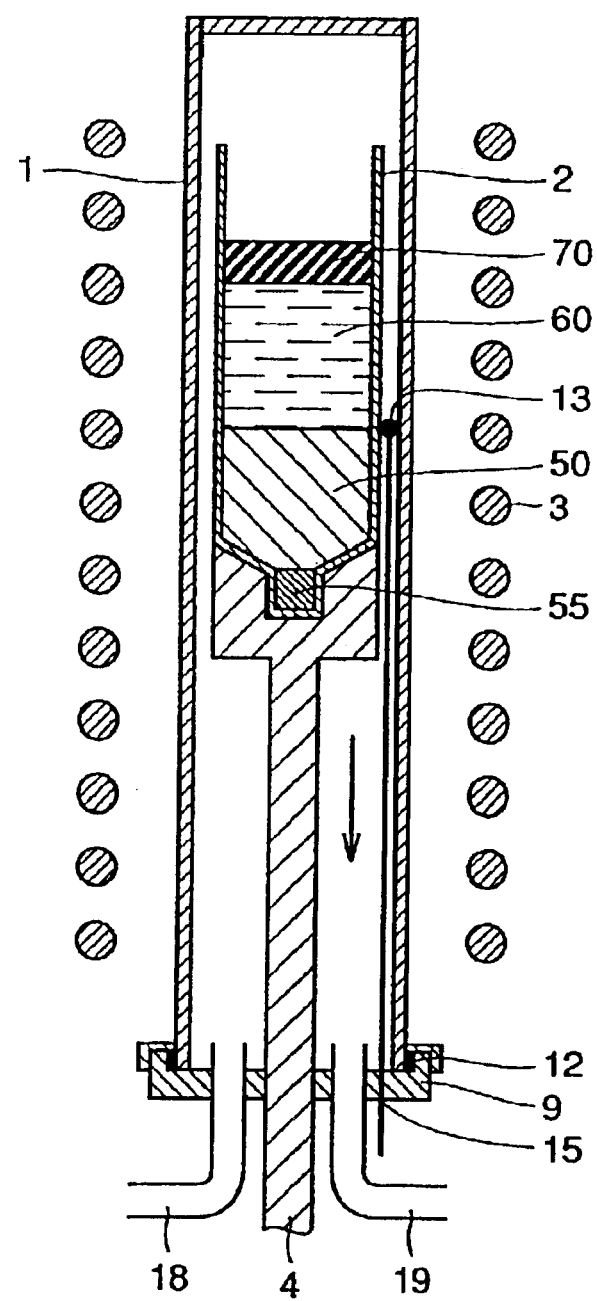
FIG. 13 is a sectional view showing a schematic structure of an apparatus having an open end at only one end side.

The apparatus of the present embodiment includes an aluminum oxide reactor tube that has both ends open. The open end of the reactor tube in the above embodiments is required to be formed at only at least one end side, as shown in FIG. 13, for all the methods other than the pulling method.

A method and apparatus for production used in the VB method or the pulling method are shown in the above embodiments. The present invention is also applicable to the production of a semiconductor crystal by the vertical boat method such as the VGF method or the horizontal boat method such as the HB method and the HGF method.

The above embodiments describe the case of producing a GaAs crystal. However, the present invention is also applicable to produce a compound semiconductor crystal such as CdTe crystal, InAs crystal, GaSb crystal, silicon semiconductor crystal, and germanium semiconductor crystal.

In the present embodiment, an aluminum oxide reactor tube is used. However, a reactor tube formed of elementary substance of silicon nitride, aluminum nitride, or silicon carbide can be used in addition to the elementary substance of aluminum oxide. Also, the reactor tube can be formed of a composite material with silicon carbide, silicon nitride, aluminum nitride, boron nitride, aluminum oxide, magnesium oxide, mullite, and carbon as the base and having an oxidation-proof or airtight film formed on the surface thereof.

Specific examples of the present invention will be described herein after.

EXAMPLE 1

A GaAs crystal of 6 inches in diameter was actually produced by the VB method using a silicon carbide reactor tube as shown in the first embodiment. As a result, a single crystal with 25 cm in length was obtained. The obtained crystal had a low dislocation density. Variation in the carbon concentration was small by virtue of the concentration of the CO gas in the reactor tube being controlled during the growth. Thus, a crystal of high quality was obtained.

In the present example, the average yield was 50% when a similar crystal growth was carried out six times. Taking into consideration the difference in cost between the conventional apparatus including a stainless steel high pressure chamber and an apparatus including the silicon carbide reactor tube of the present example, it was found that the cost of producing a GaAs single crystal can be lowered by approximately 20% than the case where a stainless steel high pressure chamber is used.

EXAMPLE 2

A GaAs crystal of 6 inches in diameter was actually produced using an aluminum nitride reactor tube as shown in the second embodiment. GaAs polycrystal of approximately 30 kg was obtained. The purity of the obtained polycrystal was analyzed. Only the matrix element, carbon and boron were detected. The other elements were below the detection limit. The quality of the crystal was extremely high.

Figure 14:
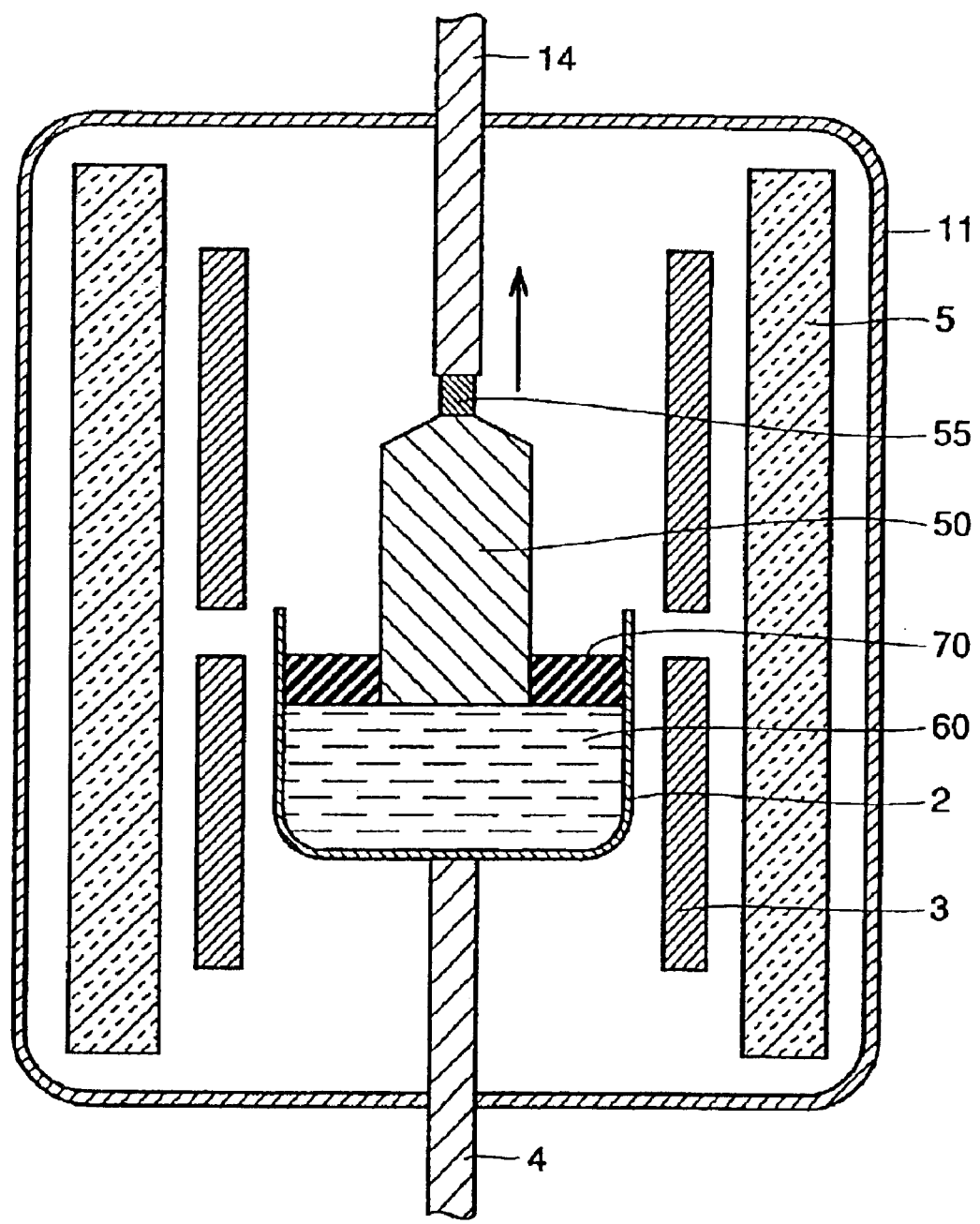
FIGS. 14 and 15 are sectional views showing a schematic structure of examples of an apparatus of producing a semiconductor crystal using a conventional stainless steel high pressure chamber.

There was no particular difference in quality from the crystal grown using an apparatus including the conventional stainless steel high pressure chamber as shown in FIG. 14. Taking into consideration the difference in cost between the conventional apparatus including a stainless steel high pressure chamber and an apparatus including the aluminum nitride reactor tube of the present example, the cost of fabricating the GaAs polycrystal could be lowered by approximately 30%.

EXAMPLE 3

A GaAs crystal of 6 inches in diameter was actually produced by the LEC method using an aluminum oxide reactor tube, as shown in the third embodiment.

The temperature gradient must be increased in the LEC method to prevent the evaporation of As during crystal growth. Therefore, the values of the average dislocation density and the residual strain of the obtained crystal were higher than those of the crystal obtained in Example 1.

In the third example, controllability of the temperature distribution was superior since the number of zones in the heater could be easily increased in the present example. As a result, generation of polycrystal at the latter stage of the crystal growth could be prevented. A single crystal could be grown that is longer than that of Comparative Example 1 that will be described subsequently.

Comparative Example 1

A GaAs crystal of 6 inches in diameter was produced by the conventional LEC method shown in FIG. 14.

The temperature gradient had to be increased as in Example 3 to prevent the evaporation of As during the crystal growth. Therefore, the values of the average dislocation density and the residual strain of the obtained crystal were greater than those of the crystal obtained in Example 1.

The controllability of the temperature distribution is limited since the number of zones in the heater cannot be increased too much due to the structure in the conventional LEC method. Therefore, generation of polycrystal could not be prevented at the latter stage of the crystal growth. The length of the single crystal was shorter than that of Example 3.

Comparative Example 2

Figure 15:
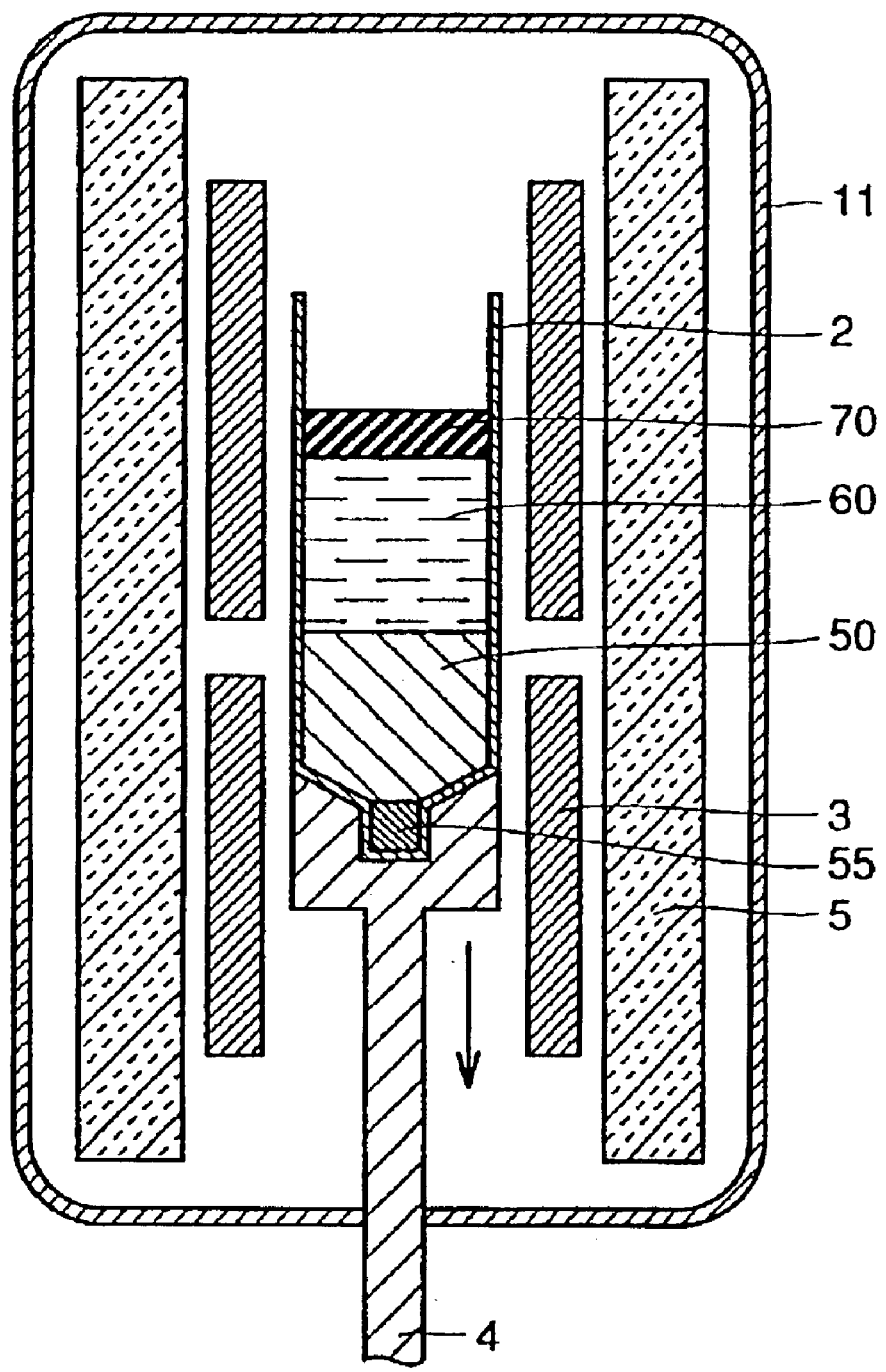

A GaAs crystal of 6 inches in diameter was produced by the conventional liquid encapsulated VB method shown in FIG. 15.

The number of zones in the heater could not be increased so much due to the structure, as in Comparative Example 1. Since the controllability of the temperature distribution is limited, generation of polycrystal could not be prevented at the latter stage of the crystal growth. Therefore, the single crystal length became shorter than that of Example 1.

In the conventional LE-VB (Liquid Encapsulated-Vertical Bridgman) method, crystal growth is effected under low pressure of the environment where carbon components such as the heater and the heat insulator are present. As a result, the obtained crystal exhibited a higher C concentration (carbon concentration and B concentration (boron concentration) than those of Examples 1–3.

Comparative Example 3

Figure 16:
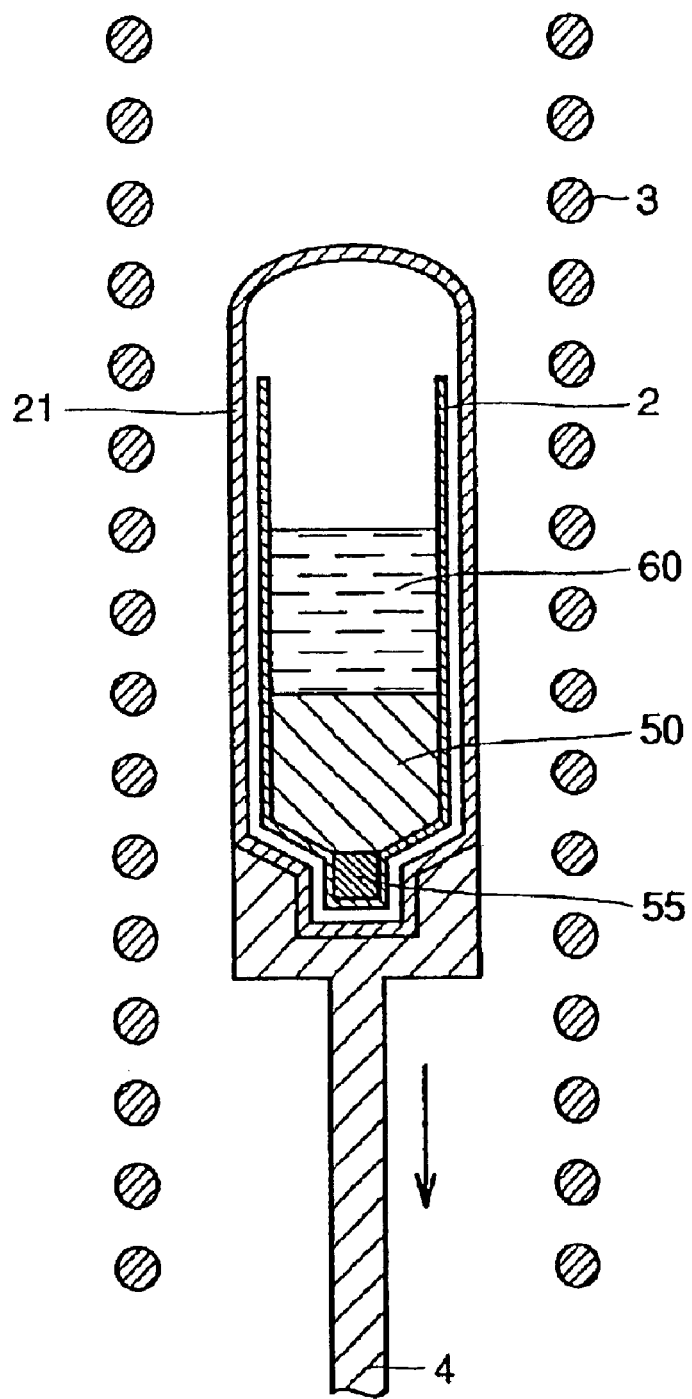
FIG. 16 is a sectional view showing a schematic structure of an example of an apparatus producing a semiconductor crystal using a conventional quartz ampoule.

A GaAs crystal of 4 inches in diameter was grown by the conventional quartz ampoule sealed VB method shown in FIG. 16. In the conventional quartz ampoule sealed VB method, the carbon concentration in the quartz ampoule during crystal growth could not be controlled. As a result, the uniformity of the carbon concentration was poor.

Furthermore, a crystal having a diameter of 6 inches could not be grown since there was problem in the strength of the quartz ampoule.

The results of the above Examples 1–3 and Comparative Examples 1–3 are shown in the following Table 1.

TABLE 1

| | Growth Pressure ($kgf/cm^2$) | Crystal Size (Diameter × Length) | C Concentration ($cm^{-3}$) | B Concentration ($cm^{-3}$) | Dislocation Density ($cm^{-2}$) | Residual Strain | Single Crystal Length (cm) |
|---|---|---|---|---|---|---|---|
| Example 1 | 2 | 6 inches × 25 cm | $1.1\sim1.5 \times 10^{15}$ | $0.5\sim0.8 \times 10^{16}$ | $3\sim5 \times 10^3$ | $5 \times 10^{-6}$ | 25 |
| Example 2 | 2 | 6 inches × 30 cm | $0.5\sim1.0 \times 10^{15}$ | $0.2\sim0.6 \times 10^{16}$ | — | — | — |
| Example 3 | 3 | 6 inches × 15 cm | $0.6\sim1.1 \times 10^{15}$ | $0.1\sim0.7 \times 10^{16}$ | $4\sim7 \times 10^4$ | $4 \times 10^{-5}$ | 15 |
| Comparative Example 1 | 20 | 6 inches × 15 cm | $1.0\sim1.8 \times 10^{15}$ | $0.5\sim1.0 \times 10^{16}$ | $8\sim10 \times 10^4$ | $5 \times 10^{-5}$ | 10 |
| Comparative Example 2 | 2 | 6 inches × 25 cm | $2.0\sim4.1 \times 10^{15}$ | $3.0\sim5.0 \times 10^{16}$ | $1\sim2 \times 10^4$ | $6 \times 10^{-6}$ | 15 |
| Comparative Example 3 | 1 | 4 inches × 20 cm | $0.7\sim2.5 \times 10^{15}$ | $0.6\sim0.9 \times 10^{16}$ | $2\sim4 \times 10^3$ | $4 \times 10^{-6}$ | 20 |

EXAMPLE 4

Si doped GaAs was grown by the VGF method under the pressure of 2 atm of $N_2$ gas using an airtight reactor tube of silicon nitride of high purity. As a result, a single crystal with 20 cm in length and 3 inches in diameter was obtained.

The purity of the obtained crystal was analyzed. It is found that over the entire crystal, the concentration of all the impurities including carbon was not more than $5 \times 10^{14}$ $cm^{-3}$ except for Si. The obtained crystal was extremely high in purity.

EXAMPLE 5

Undoped GaAs was grown by the VGF method under the $N_2$ gas pressure of 1.2 atm using a reactor tube of a composite material having the surface of a base of graphite coated with silicon carbide to a thickness of 50 μm. It was confirmed that the reactor tube had the sufficient airtightness with the arrived degree of vacuum of not more than $1\times10^{-2}$ Torr. As a result, a single crystal of 30 cm in length and 3 inches in diameter was obtained.

The purity of the obtained crystal was analyzed. It was found that, over the entire crystal, the carbon concentration was $1\sim2\times10^{15}$ cm$^{-3}$, and the concentration of the other impurities was not more than $5\times10^{14}$ cm$^{-3}$. The resistivity was $1\sim3\times10^7$ Ωcm. Thus, a GaAs crystal of extremely favorable semi-insulating property was obtained.

EXAMPLE 6

A Si doped GaAs was grown by the VGF method under the Ar gas pressure of 1.5 atm using a reactor tube formed of a composite material having the surface of a base of porous mullite of low purity coated with aluminum oxide of high purity to a thickness of 100 μm. It was confirmed that the reactor tube had sufficient airtightness with the arrived degree of vacuum of not more than $1\times10^{-3}$ Torr. As a result, a single crystal of 3 inches in diameter and 15 cm in length was obtained.

The purity of the obtained crystal was analyzed. The concentration of all the impurities including carbon was not more than $5\times10^{14}$ cm$^{-3}$ except for Si over the entire crystal. Thus, the purity was extremely high.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor crystal comprising a semiconductor material, and having a diameter of at least 6 inches and an average dislocation density of not more than $1\times10^4$ cm$^{-2}$.

2. The semiconductor crystal according to claim 1, wherein said semiconductor crystal is a substrate, in combination with a layer formed on said substrate.

3. The semiconductor crystal according to claim 1, wherein said diameter is at least 8 inches.

4. The semiconductor crystal according to claim 1, wherein said semiconductor material is GaAs.

5. The semiconductor crystal according to claim 1, wherein said semiconductor material is a compound semiconductor material selected from the group consisting of CdTe, InAs, and GaSb.

6. The semiconductor crystal according to claim 1, wherein said semiconductor material is an elemental semiconductor material selected from the group consisting of Si and Ge.

7. The semiconductor crystal according to claim 1, wherein said semiconductor crystal is a single crystal.

8. The semiconductor crystal according to claim 1, further comprising a positive content of boron, with a boron concentration of less than $3\times10^{16}$ cm$^{-3}$.

9. The semiconductor crystal according to claim 8, wherein said boron concentration is not more than $1\times10^{16}$ cm$^{-3}$.

10. The semiconductor crystal according to claim 1, further comprising a positive content of carbon, with a carbon concentration of $0.5\times10^{15}$ cm$^{-3}$ to $1.5\times10^{15}$ cm$^{-3}$.

11. The semiconductor crystal according to claim 1, wherein said semiconductor crystal is an elongated ingot extending longitudinally in a length direction, said semiconductor crystal further comprises a positive content of carbon, with a local concentration of said carbon varying by no more than ±50% about a target carbon concentration over a range of said length direction corresponding to a fraction solidified of 0.1 to 0.8 of said ingot.

12. The semiconductor crystal according to claim 1, wherein said average dislocation density is not more than $5\times10^3$ cm$^{-2}$.

13. The semiconductor crystal according to claim 1, wherein said semiconductor crystal is a semiconductor crystal wafer having a thickness in a range from 500 to 700 μm.

14. The semiconductor crystal according to claim 1, having an average residual strain as measured by a photoelastic effect being not more than $1\times10^{-5}$.

* * * * *